US008072120B2

(12) United States Patent
Awtar

(10) Patent No.: US 8,072,120 B2
(45) Date of Patent: Dec. 6, 2011

(54) MULTIPLE DEGREES OF FREEDOM MOTION SYSTEM

(75) Inventor: Shorya Awtar, Ann Arbor, MI (US)

(73) Assignee: Shorya Awtar, Ann Arbor, MI (US)

( * ) Notice: Subject to any disclaimer, the term of this patent is extended or adjusted under 35 U.S.C. 154(b) by 349 days.

(21) Appl. No.: 12/324,070

(22) Filed: Nov. 26, 2008

(65) Prior Publication Data

US 2010/0126296 A1 May 27, 2010

(51) Int. Cl.
*H01L 41/08* (2006.01)

(52) U.S. Cl. .......................................... 310/328; 73/782

(58) Field of Classification Search .................. 310/328, 310/323.01, 323.21, 318, 317, 316; 73/782; 74/521; 248/370; *H01L 41/08*

See application file for complete search history.

(56) References Cited

U.S. PATENT DOCUMENTS

| | | | | |
|---|---|---|---|---|
| 5,832,783 | A * | 11/1998 | Sheldon | 408/234 |
| 5,987,726 | A * | 11/1999 | Akeel | 74/490 |
| 6,193,226 | B1 * | 2/2001 | Davies | 269/71 |
| 6,402,329 | B1 * | 6/2002 | Bailly et al. | 248/476 |
| 6,688,183 | B2 * | 2/2004 | Awtar et al. | 73/782 |

* cited by examiner

*Primary Examiner* — Thomas Dougherty
*Assistant Examiner* — Karen B Addison

(57) ABSTRACT

A multiple degrees of freedom motion system comprising an arrangement of rigid stages, flexure constraint modules, actuators, and sensors. These components of the motion system are arranged and connected in a systematic fashion to provide a high degree of decoupling between the motion axes, suitable placement of ground-mounted actuators to actuate each motion axis, and suitable placement of sensors to allow end-point measurement along each motion axis. This arrangement of rigid stages, flexure constraint modules, actuators and sensors enables large motion range and high motion quality in the motion system, while using standard and commonly available components.

17 Claims, 8 Drawing Sheets

MULTIPLE DEGREES OF FREEDOM MOTION SYSTEM

FIELD OF THE INVENTION

The present invention relates to a multiple degrees of freedom motion system comprising an arrangement of rigid stages, flexure constraint modules, actuators, and sensors.

BACKGROUND OF THE INVENTION

The present invention relates to a motion system comprising an arrangement of rigid stages, flexure constraint modules, actuators, and sensors. This unique arrangement results in large motion range along with high motion quality, while using standard and commonly available components. Motion quality, in the context of a motion system, is defined in terms of precision, also known as bi-directional repeatability of motion; accuracy, also known as trueness of motion; and, resolution, also known as minimum incremental motion.

In the relevant art, a 'motion system' is understood to be a system that enables the motion of a rigid body or stage, commonly referred to as the Motion Stage, in a controlled fashion so as to follow a desired motion trajectory with respect to a reference Ground stage. In particular, the motion system does not refer to a specific component such as the bearing that guides the motion, or the actuator that generates the motion, or the driver that operates the actuator, or the sensor that measures the motion, or the electronics that is used with the sensor, or the controller that controls the motion. Instead, a motion system is a combination of one or more these components. The term 'motion system' is used here in the context of this generally accepted definition.

The directions along which a motion system provides motions or displacements at the Motion Stage are referred to as the 'degrees of freedom' (DoF), which can be translational or rotational. A motion system that provides displacement at the Motion Stage along a single direction is referred to as a single-DoF motion system; likewise, a motion system that provides displacements at the Motion Stage along multiple directions is referred to as a multi-DoF motion system. A motion system may provide a maximum of six DoF at the Motion Stage—three translations (typically along the X, Y and Z directions), and three rotations (about the X, Y and Z directions).

Motion systems that are capable of nanometric or sub-nanometric motion quality in terms of precision, accuracy, and resolution are also referred to as 'nanopositioning systems' in the relevant art. This present invention more specifically relates to multi-DoF nanopositioning systems capable of large motion range along each DoF direction, while using commonly available components.

Existing multi-DoF motion systems that provide nanometric motion quality are limited to hundreds of microns in motion range. Compact, desktop-size, and multi-DoF motion systems that can provide motion range of the order of several millimeters and yet achieve nanometric motion quality are desirable in a broad range of applications including scanning probe microscopy, nanolithography, single molecule experiments, molecular spectroscopy, drug discovery applications, hard-drive testing, micro and nano manipulation, and bio-imaging for stem cell research, to name a few.

There have existed several challenges in achieving the large motion range and high motion quality simultaneously in multi-DoF motion systems. One of the most fundamental of these challenges is the choice and design of a motion bearing that provides guided motion along multiple DoF directions. Several existing motion bearing methods are described next.

Motion guidance and load bearing in magnetic bearings is achieved by means of an advanced magnetic circuit design that is stabilized by feedback controls. With single-DoF magnetic bearing based systems, one can achieve large motion range as well as very high resolution, owing to non-contact operation. Since the motion bearing is a challenging subsystem in itself, the resulting motion systems are typically characterized by high complexity, cost, and maintenance, and relatively large sizes. Magnetic bearings are primarily suited for single-DoF motion systems. Multi-DoF system may be created by serially stacking multiple single-DoF motion systems, one on another.

Air bearings are also capable of large range and very high resolution due to the lack of physical contact between moving parts, but are suited for single-DoF motion systems, as in the previous case. An air bearings based multi-DoF motion system may be produced by serially stacking single-DoF systems. Such serial designs are generally bulky and involve moving cables and actuators, which pose a challenge for high precision, speed-of-response, and ease of assembly. Furthermore, air bearings need a constant supply of clean, high-pressure and low-humidity air, require periodic filter changes, and are not suitable for vacuum environment.

The traditional bearing technology for motion systems employs either rolling joints (e.g. ball bearings) or sliding joints (e.g. guiderails). Multi-DoF systems may be constructed via either serial or parallel kinematics. Precision ground, highly accurate, and pre-loaded recirculating ball bearings may be used to provide motion guidance; precision micrometers, lead-screws, or ball-screws may be used to transmit the motion from the actuator to the bearing stage. Despite utmost care in manufacturing and assembly, it is extremely difficult to improve the motion quality beyond 100 nm in these systems due to non-deterministic effects such as rolling of balls, sliding of surfaces, interface tribology, friction, and backlash.

Another alternative in bearing design—the coarse-fine scheme—has also been used to achieve the large motion range and high motion quality objective by mounting a small-range high-quality fine flexure stage, described below, on a traditional large-range lower-quality coarse stage. This arrangement results in additional complexity in terms of parts, assembly and operation, and is still not able to achieve high precision or bi-directional repeatability.

Flexure bearings are the most common and practical bearing choice for desktop-size nanopositioning systems. A monolithic construction entirely eliminates friction and backlash allowing theoretically infinite resolution and repeatability. Monolithic construction also reduces part counts and assembly steps, requires zero maintenance, provides infinite life when designed properly, and can operate in any kind of vacuum or harsh environment. Multi-DoF motion systems based on flexure bearings may be constructed via either serial-kinematics or parallel-kinematics.

A serial-kinematic multi-DoF motion system comprises of multiple single-DoF motion systems stacked one on another serially. However, this configuration is often bulky, and results in moving cables and actuators. Moving cables are a source of disturbance and affect the motion quality, while moving actuators represent large moving masses that are detrimental to the dynamic performance of the motion system. Furthermore, moving connections and actuators are difficult to implement in micro-scale applications, for example Micro Electro-Mechanical Systems (MEMS). Parallel-kinematic designs are free of these problems because they employ ground-mounted actuators and are often more compact and economical. Compared to serial-kinematic designs, the main drawbacks of traditional parallel-kinematic designs include relatively smaller motion range, potential for over-constraint, and greater error motions. Furthermore, parallel kinematic designs are not obvious and therefore are not as straightforward to design as serial kinematic designs. Despite all these factors, parallel kinematic designs generally more preferable due to their compactness, motion quality and manufacturability.

The design of a large range parallel kinematic multi-DoF flexure bearing is non-obvious and challenging. Furthermore, to achieve large motion range and high motion quality simultaneously in a motion system, the selection of practically feasible and commonly available actuators and sensors, and their integration with the flexure bearing are equally important. In general, this is a challenge because commonly available actuators and sensors have several limitations that restrict their use in multi-DoF nanopositioning systems.

It is important that the motion system design be such that commonly available actuators may be used while exploiting their specific advantages and accommodating their limitations. As stated earlier, a parallel kinematic configuration is preferable which means that all the actuators should be ground mounted, i.e. their Stators are fixed with respect to the reference Ground of the motion system. For effective ground-mounting, the attribute of 'actuator isolation' is important in a motion system. In a multi-DoF motion system, actuator isolation implies that the actuation for one DoF does not produce any displacements at the point of actuation for any other DoF; furthermore, the point or location on the flexure bearing along which actuation for a particular DoF is applied, should move along the direction of the applied actuation only and not otherwise. It should be obvious that good actuator isolation allows easy ground mounting of actuators, which is important in parallel-kinematic designs. More importantly, actuator isolation enables the use of commonly available linear actuators.

In a general, an actuator comprises a Stator and a Mover. In a motion system, the Stator is attached to one rigid body and the Mover is attached a second rigid body. The actuator produces an actuation force or displacement between the Stator and Mover, and this actuation is transmitted between the two associated rigid bodies. Commonly, the Stator is attached to a static Ground stage, while the Mover is attached to a moving stage. However, this arrangement may be reversed depending on the design, configuration, and assembly of the motion system. In some instances, neither of the rigid bodies involved is a static Ground stage.

While commonly available linear actuators can provide large motion range, or high motion quality, or both, they provide this motion along their own well-defined 'actuation axis', which has to be lined up with the appropriate point of actuation on the flexure bearing. These actuators typically do not tolerate any deviation from their actuation axis. If a flexure bearing is such that the point of actuation for a certain DoF drifts off from the actuator's actuation axis, then upon assembly the motion system will very likely suffer from binding, ultimately leading to damage of the flexure bearing and/or the actuator. Thus, actuator isolation is critical in a motion system to achieve large stroke and high motion quality using common actuators.

Some specific examples of actuators are provided here to highlight the above described limitation of common actuators. Piezo-electric actuators, typically based on Lead Zirconate Tintanate (PZT) ceramic stacks provide extremely high motion resolution, although their motion range is small. However, any loads acting in directions other than the axis of the brittle ceramic stack, which is also the actuation axis, cause permanent damage to the actuator. 'Inch-Worm' style actuators, based on a repetitive hold-step-release action achieved by means of an array of piezo-electric ceramics, provide large motion range and high motion resolution. But here also this motion is strictly guided along a specified axis. Electromagnetic actuators, such as voice-coils, provide large range and high resolution, but also have to be guided along the coil's axis, which becomes the actuation axis, to ensure uniform and useful actuation-force generation. Electrostatic actuators are an example of actuators that do not have to be guided along a specified axis and are relatively insensitive to off-axis displacements. However, they provide relatively lower force capability, and therefore are impractical for many motion systems.

Moreover, actuator isolation in a motion system also eliminates the need for a dedicated bearing for the actuator and a decoupler between the actuator's Mover and the point of actuation on the flexure bearing. Since the flexure bearing provides guided motion at the point of actuation, the Mover of the actuator may be directly connected to this location on the flexure bearing. This reduces overall size, number of parts, and complexity in the design.

The sensing demands for large range, high motion quality, and multi-DoF motion systems are equally challenging. Given the high motion quality requirement, end-point measurement of the displacements along the DoF is essential. End-point measurement implies an absolute measurement of the displacements of the Motion Stage along the DoF directions, with respect to Ground. In addition, multi-DoF measurements demand that the sensor for one DoF be tolerant of displacements along the other DoF. While Linear Variable Differential Transducers (LVDT) and linear optical encoders provide large measurement range and high measurement resolution, they have a well-defined axis of measurement, also known as the sensing axis. These sensors are restricted to measurements along the sensing axis and are intolerant to any motion that deviates from the sensing axis. Capacitance probes, on the other hand, provide very high resolution and tolerate large off-axis displacements, making them highly suitable for multi-DoF motion system. However, with nanometric resolution, their measurement range is typically limited to hundreds of microns, and therefore do not readily meet the desired objective of large motion range and high motion quality. Similarly, strain gauges and piezo-resistive sensors can provide nanometric resolution but at the cost of measurement range; moreover, they are also limited in terms of measurement accuracy. Laser interferometry is one of the few sensing options that provide large range, high resolution and tolerance to off-axis displacements. Yet, it is an impractical option for desktop-size nanopositioning systems, given the associated equipment size, lack of compact packaging, and high cost.

Because of these limitations in flexure bearings, actuators, and sensors, multi-DoF motion system designs that provide large motion range and high motion quality are not found in the prior art.

BRIEF SUMMARY OF THE INVENTION

In one non-limiting aspect of this invention, a three-DoF (X, Y and Z) motion system that provides large motion range as well as high motion quality (precision, accuracy, and bi-directional repeatability) using commonly available components, is proposed. The three DoF represent translational motions along the X, Y and Z directions. In the preferred embodiment, these three directions are mutually perpendicular.

This motion system provides an arrangement of a Ground, Motion Stage, and intermediate stages, interconnected by flexure constraint modules such that the Motion Stage exhibits its highly decoupled displacements along the X, Y and Z DoF with respect to the static Ground. The motion system further comprises ground mounted actuators, one for each DoF. The first actuator, second actuator, and third actuator provide actuation for the X, Y, and Z DoF of the Motion Stage, respectively.

Actuator isolation in this motion system is achieved by means of a first, second and third intermediate stage. The first intermediate stage is constrained with respect to Ground such that it moves substantially along the X direction only, which coincides with the actuation axis of the first actuator. The first intermediate stage is also constrained with respect to the Motion Stage such that the X direction displacement of the first intermediate stage, generated by the first actuator, is transmitted to the Motion Stage while incurring a very small motion loss, irrespective of any Y and Z displacements of the Motion Stage.

Similarly, the second intermediate stage is constrained with respect to Ground such that it moves substantially along the Y direction only, which coincides with the actuation axis of the second actuator. The second intermediate stage is also constrained with respect to the Motion Stage such that the Y direction displacement of the second intermediate stage, generated by the second actuator, is transmitted to the Motion Stage while incurring a very small motion loss, irrespective of any X and Z displacements of the Motion Stage.

Similarly, the third intermediate stage is constrained with respect to Ground such that it moves substantially along the Z direction only, which coincides with the actuation axis of the third actuator. The third intermediate stage is also constrained with respect to the Motion Stage such that the Z direction displacement of the third intermediate stage, generated by the third actuator, is transmitted to the Motion Stage while incurring a very small motion loss, irrespective of any X and Y displacements of the Motion Stage.

Thus, each actuator is connected to an intermediate stage that moves along its actuation axis only. The actuator for any given DoF produces motion at the Motion Stage along that DoF only and very little or no motion along the other two DoF. Furthermore, the actuator for any given DoF produces a substantially small or no motion at the point of actuation for the other two DoF. For example, the first actuator produces a substantially small or no motion as the second and third intermediate stages, and so on. This high degree of actuator isolation in the proposed motion system enables the use of commonly available large range high resolution linear actuators, for example, voice-coil actuators.

The end-point measurement of the Motion Stage displacement, along any given DoF, with respect to Ground is obtained by dividing the sensing task into two achievable and easier sensing tasks. For measuring the displacement along the X DoF of the Motion Stage, first the large range X direction displacement of the first intermediate stage with respect to Ground is measured using a large measurement range and high resolution sensor, e.g., an LVDT or linear encoder. The prescribed sensing axis of this first sensor is made to align with the X direction displacement of the first intermediate stage. Next, the relative displacement of the Motion Stage in the X direction with respect to the first intermediate stage is measured using a sensor that allows off-axis motions, e.g. capacitance probes. Ideally, the entire X direction displacement of the first intermediate stage should be transmitted to the Motion Stage, and therefore there is substantially zero relative X direction displacement between the two. This is because the Motion Stage is constrained to move only in the Y and Z directions with respect to the first intermediate stage. However, since this constraint arrangement is implemented via real-life flexure constraint modules, described in further detail later, some deviation from ideal behavior is to be expected. Therefore, the relative X displacement between the Motion Stage and the first intermediate stage may not necessarily be zero, but is still generally very small. In particular for nanopositioning systems, it is important to measure this small motion. Thus, this second sensing task is successfully accomplished using a secondary sensor that provides high resolution and is tolerant to off-axis motions, even if it only capable of a small measurement range. This secondary sensor is located between the first intermediate stage and the Motion Stage, for example, the sensor may be rigidly mounted to the first intermediate stage and the sensor target maybe be rigidly mounted to the Motion Stage. The Motion Stage will have large Y and Z direction displacements with respect to the first intermediate stage, which are well tolerated by the secondary sensor.

The electronic signals, which represent the above described measurements from the first and secondary sensors, are fed to a computer or controller that combines the two to provide an absolute measurement of the displacement of Motion Stage along the X DoF direction with respect to Ground. This computed signal may then be used for the purpose of controlling motion of the Motion Stage, as part of the overall motion system operation. It is noteworthy that the individual sensors described above are unable to meet the sensing requirements of large range, high resolution, and tolerance to off-axis motions, all by themselves. The arrangement of rigid stages, flexure constraints, and two sensors per DoF, provided by the proposed motion system is able to meet the overall sensing requirements.

Sensing schemes analogous to the one described above for the X DoF of the Motion Stage are employed to measure the absolute displacements of the Motion Stage along the Y and Z DoF as well.

Thus, in accordance with the present motion system invention, standard and commonly available sensors and actuators are employed in fashion that their capabilities are fully exploited and yet their limitations are accommodated, while meeting the overall objective of large range motion and high motion quality.

A flexure constraint module, in the context of this invention, is defined to be an assembly of flexible elements, rigid elements, and/or damping elements. A flexure constraint module constrains the relative motion between two rigid stages. It is well known that a rigid stage has a maximum of six possible Degrees of Freedom (DoF) with respect to another rigid stage, in general. A single translational DoF flexure constraint module connected between two rigid stages limits the motion of one rigid stage to a single translation with respect to the other rigid stage, while constraining the remaining five DoF.

An ideal flexure constraint module should allow zero resistance and infinite motion range along the directions that it does not constrain, and infinite stiffness and zero motion along directions that it constrains. However, it should be recognized that, in practice, flexure constraint modules are generally non-ideal. Therefore, a small but finite motion and large but finite stiffness is common along the constrained directions of most common flexure constraint modules. Similarly, small but finite resistance and large but finite range is common along the DoF directions that the flexure constraint module does not constrain.

The Motion Stage, Ground and intermediate stages are all rigid, and may incorporate rigid extensions to facilitate assembly with sensors and actuators or to minimize undesired errors in sensing and actuation.

DETAILED DESCRIPTION OF THE INVENTION

Figure 1:
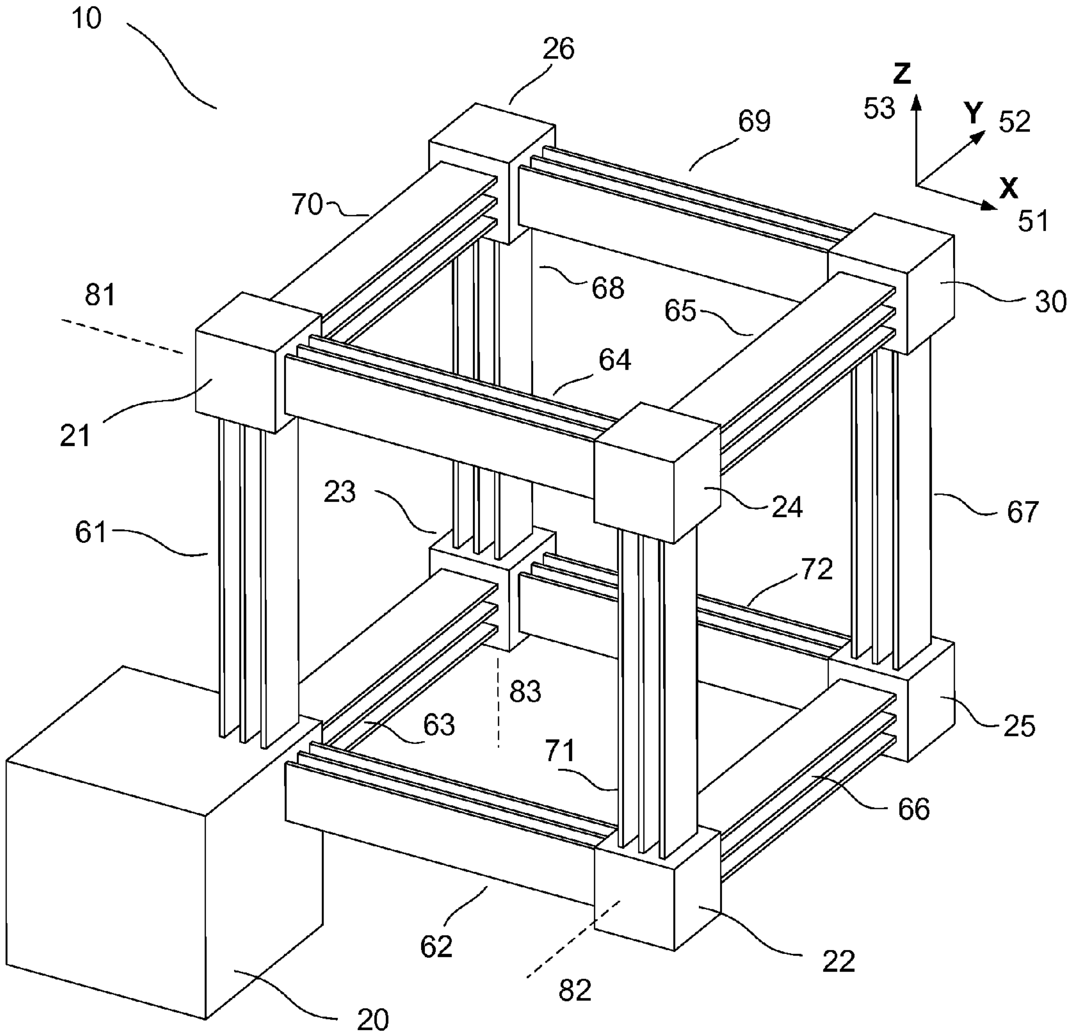
FIG. 1 shows a large motion range three-DoF motion system that provides highly decoupled motion along the three translational DoF—X, Y and Z.

Referring now to FIG. 1, a motion system 10 is shown. The motion system 10 includes a Ground 20, which is the reference stage of the motion system, and a Motion Stage 30. The Motion Stage has three translational Degrees of Freedom with respect to Ground—X, Y and Z, indicated by 51, 52 and 53, respectively. Ground 20 is connected to a first intermediate stage 21 via a single DoF flexure constraint module 61, which only allows relative X translation between the two rigid stages. Ground 20 is also connected to a second intermediate stage 22 via a single DoF flexure constraint module 62, which only allows relative Y translation between the two. Ground 20 is further connected to a third intermediate stage 23 via a single DoF flexure constraint module 63, which only allows a relative Z translation between the two.

The first intermediate stage 21 is connected to a fourth intermediate stage 24 via a single DoF flexure constraint module 64, which only allows relative Y translation between the two. The fourth intermediate stage 24 is connected to the Motion Stage 30 via a single DoF flexure constraint module 65, which only allows relative Z translation between the two. The second intermediate stage is further connected to a fifth intermediate stage 25 via a single DoF flexure constraint module 66, which only allows relative Z translation between the two. The fifth intermediate stage is connected to the Motion Stage via a single DoF flexure constraint module 67, which only allows a relative X translation between the two. The third intermediate stage 23 is connected to a sixth intermediate stage 26 via a single DoF flexure constraint module 68, which only allows a relative X translation between the two. The sixth intermediate stage 26 is connected to the Motion Stage 30 via a single DoF flexure constraint module 69, which only allows relative Y translation between the two.

Furthermore, the first intermediate stage 21 is connected to the sixth intermediate stage 26 via a single DoF flexure constraint module 70, which only allows a relative Z translation between the two. The second intermediate stage 22 is connected to the fourth intermediate stage 24 via a single DoF flexure constraint module 71, which only allows a relative X translation between the two. The third intermediate stage 23 is connected to the fifth intermediate stage 25 via a single DoF flexure constraint module 72, which only allows a relative Y translation between the two.

The flexure constraint modules 61, 67, 68, and 71 are generally parallel; the flexure constraint modules 62, 64, 69, and 72 are generally parallel; and, the flexure constraint modules 63, 65, 66, and 70 are generally parallel.

With this arrangement of rigid stages and flexure constraint modules, the first intermediate stage is constrained to move largely along an X direction 81 only, the second intermediate stage is constrained to move largely along a Y direction 82 only, and the third intermediate stage is constrained to move largely along a Z direction 83 only. Given the nature of the constraint modules used, the X direction displacement of the first intermediate stage is effectively transmitted to the fourth and sixth intermediate stages, 24 and 26, as well as the Motion Stage 30. Similarly, the Y direction displacement of the second intermediate stage 22 is effectively transmitted to the fourth and fifth intermediate stages, 24 and 25, as well as to the Motion Stage 30. Similarly, the Z direction displacement of the third intermediate stage 23 is effectively transmitted to the fifth and sixth intermediate stages, 25 and 26, as well as the Motion Stage 30. Thus, the fourth intermediate stage 24 is generally constrained to move along the X and Y directions only, or in other words, in the X-Y plane only. Similarly, the fifth intermediate stage 25 is constrained to move in the Y-Z plane only, and the sixth intermediate stage 26 is constrained to move in the X-Z plane only.

With this arrangement, the Motion Stage 30 inherits the X, Y, and Z direction displacements of the first (21), second (22), and third (23) intermediate stages, respectively, and is thus free to move along these three directions. These three translational displacements of the Motion Stage 30 with respect to Ground 20 represent the three DoF provided by the motion system 10. Most importantly, these three DoF of the Motion Stage are substantially decoupled, i.e., a displacement along one DoF can happen irrespective of the displacements along the other two DoF. This decoupling provides a relatively large motion range along each DoF direction.

Ground 20, Motion Stage 30 and the intermediate stages 21, 22, 23, 24, 25, and 26, are all substantially rigid. These stages may, in general, incorporate rigid extensions to facilitate assembly with sensors and actuators and/or to minimize undesired errors in sensing and actuation.

Each of the flexure constraint modules 61, 62, 63, 64, 65, 66, 67, 68, 69, 70, 71 and 72, is an assembly of three parallel flexible beams that interconnect two rigid stages in the motion system 10. Each of these flexure constraint modules allows only one translational DoF between the two rigid stages that it interconnects. In general, any flexure constraint module that constrains all relative DoF except one translational DoF between two rigid stages may be used in this invention.

This arrangement of flexure constraint modules and rigid stages in motion system 10 also constrains the three undesired rotations of the Motion Stage, about the X (51), Y (52) and Z (53) directions. Since each individual flexure constraint module constrains all relative rotations, the resulting rotations of the Motion Stage are ideally zero and practically very small despite the X, Y, and Z direction translations. The lack of substantial undesired rotations of the Motion Stage eliminates the need for additional components and features to actively cancel out these rotations.

Figure 2:
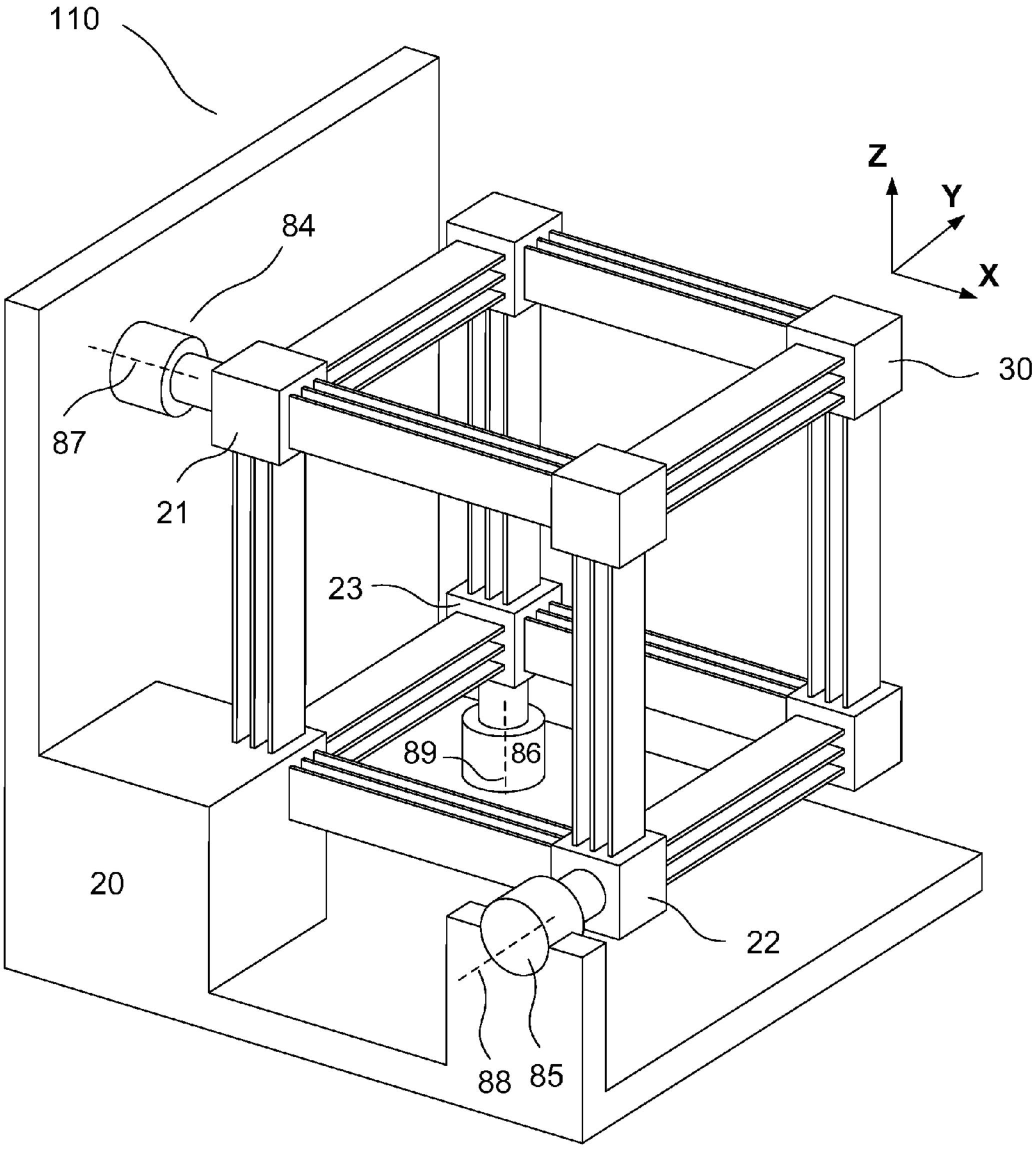
FIG. 2 shows a large motion range three-DoF motion system that further includes three actuators for the X, Y and Z DoF.

Referring now to FIG. 2, a three-DoF motion system 110, which comprises the motion system 10 of FIG. 1 and additional actuators 84, 85 and 86, is shown. The fact that the first intermediate stage 21 moves only along the X direction and this motion is transmitted to the Motion Stage 30, makes the former an ideal location for the application of the X DoF actuation. Similarly, the second (22) and third (23) intermediate stages are ideal locations for the Y DoF and Z DoF actuation, respectively.

A first actuator 84 is provided between Ground 20 and first intermediate stage 21 such that the actuation axis 87 of the first actuator 84 lines up with the X displacement direction of the first intermediate stage 21. A second actuator 85 is provided between Ground 20 and second intermediate stage 22 such that the actuation axis 88 of the second actuator 85 lines up with the Y displacement direction of the second intermediate stage 22. A third actuator 86 is provided between Ground 20 and third intermediate stage 23 such that the actuation axis 89 of the third actuator 86 lines up with the Z displacement direction of the third intermediate stage 23.

Because of this arrangement of rigid stages, flexure constraint modules, and actuators in the motion system 110, there is a substantially one to one correspondence between the displacement produced by the first (84), second (85), and third (86) actuators, and the X, Y and Z displacements, respectively, of the Motion Stage 30. Furthermore, because of the actuator isolation described previously, each actuator produces an actuation along its actuation axis without being adversely affected by the other two actuators. Consequently, this motion system provides a significant decoupling between the three DoF, thus allowing relatively larger displacements along each direction than has been conventionally possible.

It is to be understood that each actuator may be located with respect to its associated intermediate stage as shown in FIG. 2, or any other rigid extension of the respective intermediate stage. For example, in a certain application, the exact location of the actuators with respect to their associated intermediate stages may be optimized to minimize or eliminate undesired rotations of the Motion Stage 30 with respect to Ground 20.

The actuators 84, 85 and 86 need not all be identical and may one of the various kinds commonly available, e.g., voice-coil actuators, inch-worm actuators, piezo-electric actuators, etc. These actuators may be force source actuators (typically non-contact) or displacement source actuators (typically involve contact).

Figure 3:
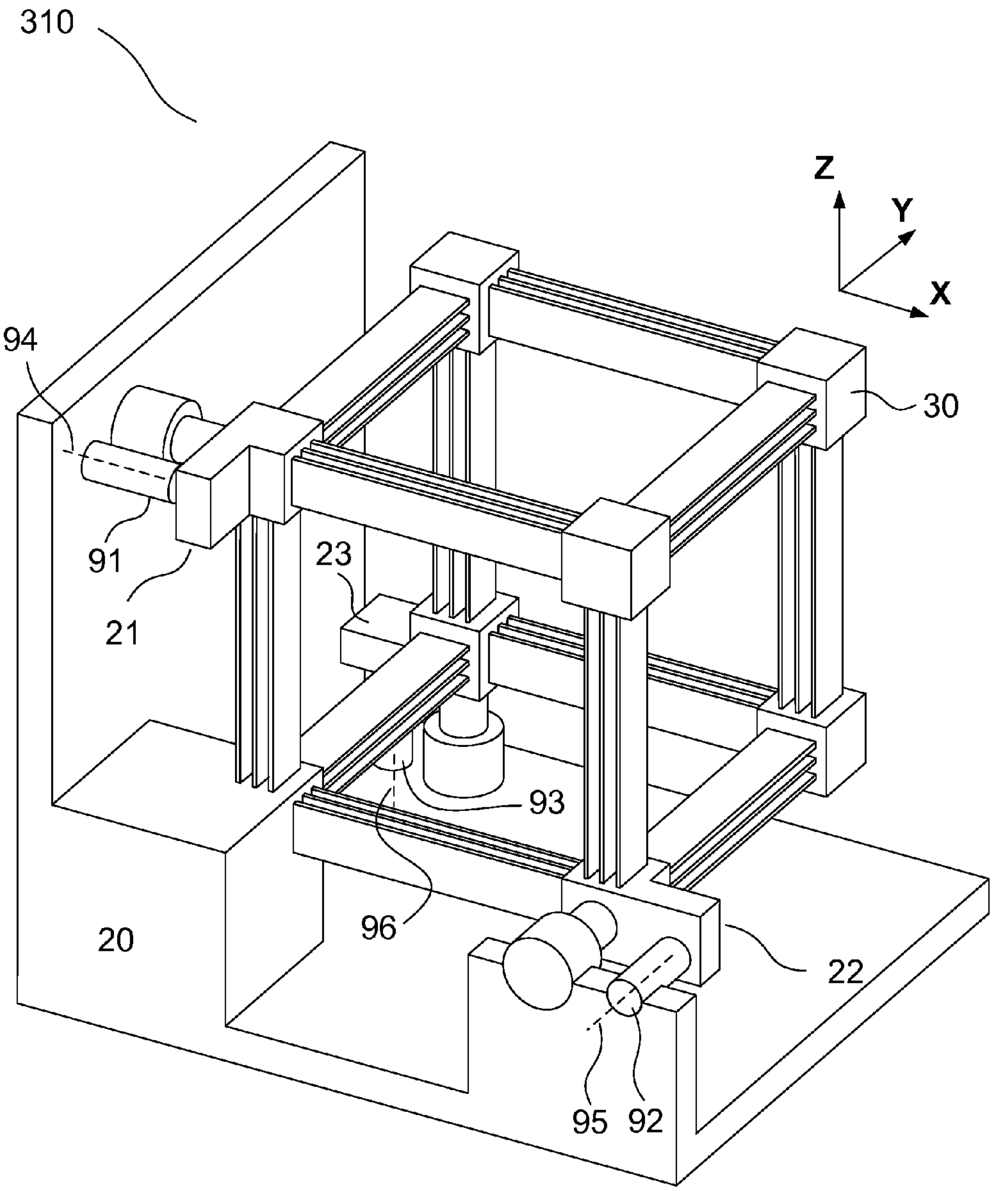
FIG. 3 shows a large motion range three-DoF motion system that includes three actuators and three sensors for the X, Y, and Z DoF.

Referring now to FIG. 3, a motion system 310 is shown which incorporates the motion system of FIG. 2 and additional sensors 91, 92 and 93. A first sensor 91 is provided to measure the X displacement of the first intermediate stage 21 with respect to Ground 20. The sensing axis 94 associated with the first sensor 91 is aligned along the direction of X displacement of the first intermediate stage 21. Because the first intermediate stage 21 is constrained to move primarily along the X direction only, the first sensor 91 can be a large range high resolution uni-directional sensor, for example, a Linear Variable Differential Transducers (LVDT) or linear optical encoder.

Similarly, a second sensor 92, with a sensing axis 95, is deployed between Ground 20 and the second intermediate stage 22, to measure the Y direction displacement of the latter with respect to Ground. Furthermore, a third sensor 93, with a sensing axis 96, is deployed between Ground 20 and the third intermediate stage 23, to measure the Z direction displacement of the latter with respect to Ground.

The measurement obtained from the first sensor 91 provides a reasonably good estimate of the X displacement of the Motion Stage 30 because the arrangement of rigid stages and flexure constraint modules in the motion system 310 is such that the X displacement of the first intermediate stage 21 is largely transmitted to the Motion Stage 30. Similarly, the second sensor 92 and the third sensor 93 provide a reasonably good estimate of the Y and Z displacements, respectively, of the Motion Stage 30.

However, for sensitive applications that require a higher degree of motion accuracy, absolute measurements of the actual X, Y and Z displacements of the Motion Stage 30 with respect to Ground 20 are needed. This is because in practice, the X displacement of the first intermediate stage 21 may not be entirely transmitted to the Motion Stage 30 since the flexure constraint modules in the motion system 310 may have inherent imperfections dues to geometry, manufacturing, assembly, etc. Thus, while the flexure constraint modules allow only one degree of freedom along a translational direction, they may also exhibit small undesired motions along the other directions that are generally constrained. Therefore, in practice the relative X displacement between the first intermediate stage 21 and the Motion Stage 30 may not necessarily be zero but will still be substantially small. However, for highly sensitive applications this substantially small relative displacement between the Motion Stage 30 and first intermediate stage 21 has to be measured and accounted for in the motion controller. Therefore, the first sensor 91 by itself is not adequate to measure the absolute displacement of the Motion Stage 30 along the X DoF. Similar limitations apply to sensors 92 and 93.

Figure 4A:
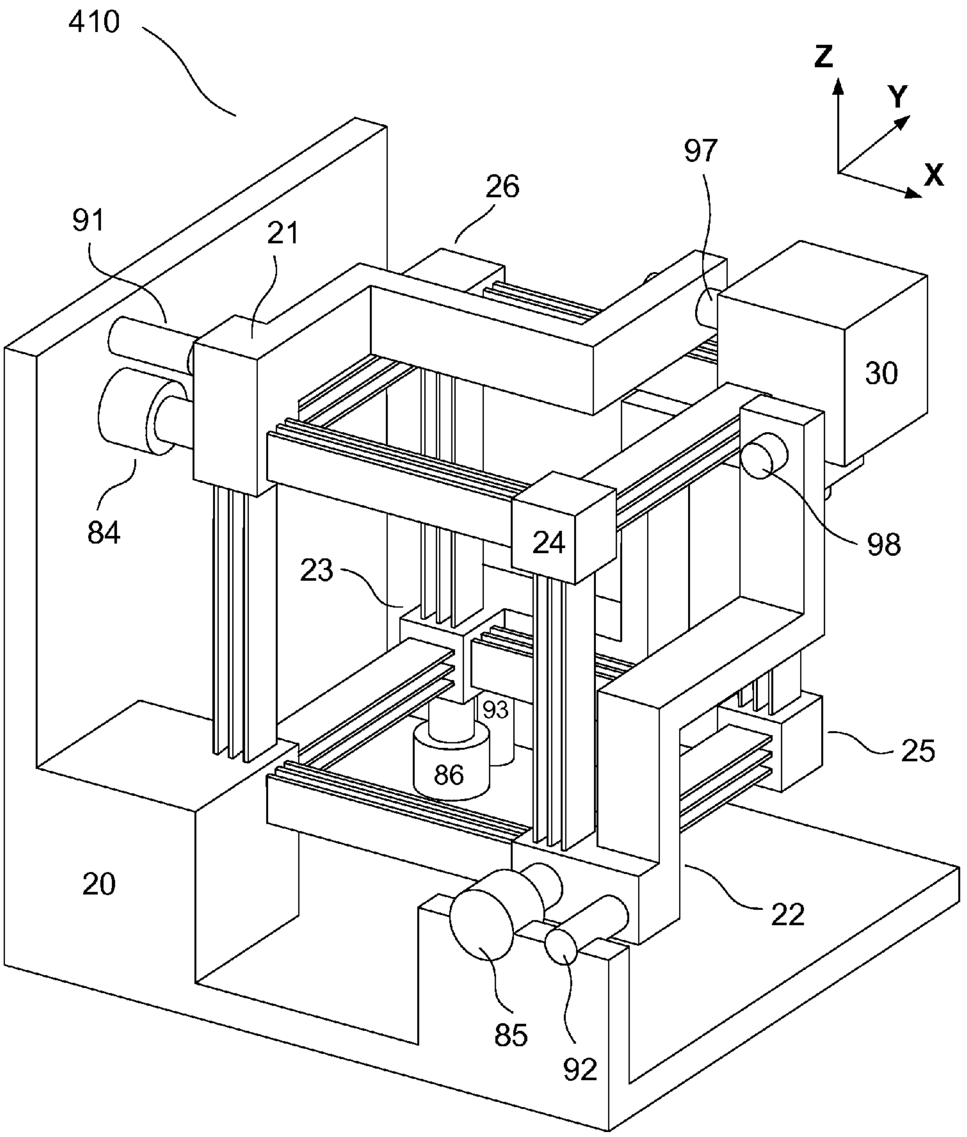
FIG. 4*a* and FIG. 4*b* show two views of a large motion range and high motion quality three-DoF motion system that includes three actuators and six sensors for the X, Y, and Z DoF.
Figure 4B:
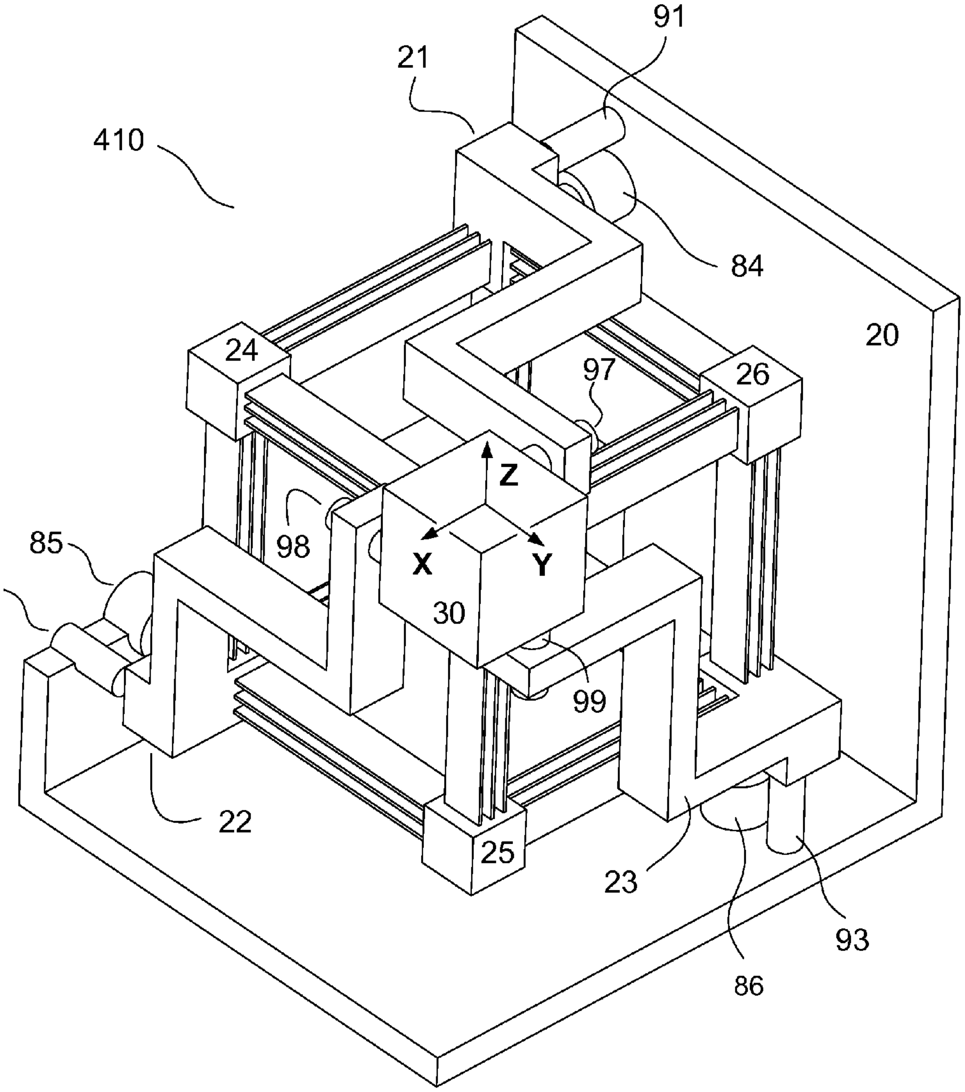

Accordingly, FIG. 4*a* and FIG. 4*b* show two views of a motion system 410 which incorporates a fourth sensor 97, a fifth sensor 98, and a sixth sensor 99, in addition to the motion system 310 of FIG. 3. The fourth sensor 97 measures the X direction displacement between the first intermediate stage 21 and the Motion Stage 30. Since the arrangement of the flexure constraint modules and rigid stages in the motion system 410 is such that the motion of the Motion Stage 30 with respect to the first intermediate stage 21 remains largely in the Y-Z plane with very small motions in the X direction, the fourth sensor 97 may be mounted on the first intermediate stage 21 and pointed at a Y-Z target plane on the Motion Stage 30. The fourth sensor 97 is chosen such that it is highly tolerant to the off-axis axis motion in the Y-Z plane even if it allows only a small measurement range along the X direction. As an example, a capacitance probe is well-suited for this measurement task. The small measurement range of the capacitance probe is not a problem because as explained earlier the relative X displacement between the first intermediate stage 21 and the Motion Stage 30 is finite but small—well within the measurement range of a capacitance probe. Other types of sensors with similar characteristics may also be used in the motion system 410.

Similarly, the fifth sensor 98 measures the Y direction displacement between the second intermediate stage 22 and the Motion Stage 30, and the sixth sensor 99 measures the Z direction displacement between the third intermediate stage 23 and the Motion Stage 30.

The measurements from the first sensor 91 and fourth sensor 97 are combined in a computer or controller (not shown) to determine the absolute displacement in the X direction of the Motion Stage 30 with respect to Ground 20. Similarly, the measurements from the second sensor 98 and fifth sensor 95 are combined in the computer or controller to determine the absolute displacement in the Y direction of the Motion Stage 30 with respect to Ground 20. Likewise, the measurements from the third sensor 93 and sixth sensor 99 are combined in the computer or controller 100 to determine the absolute displacement in the z direction of the Motion Stage 30 with respect to Ground 20.

The computer or controller also implements an open-loop or closed-loop motion control algorithm to achieve high precision, accuracy, resolution, and speed of response, along with insensitivity to disturbance and noise.

Thus, the proposed motion system 410 provides an arrangement of rigid stages, flexure constraint modules, and appropriately located sensors and actuators, such that large motion range and high resolution measurement and actuation of the X, Y, and Z DoF of the Motion Stage with respect to Ground is possible using commonly available components.

In yet another embodiment of this invention, additionally a fourth actuator may be used between the first intermediate stage and the Motion Stage to provide a relative actuation between the two in the X direction; a fifth actuator may be used between the second intermediate stage and the Motion Stage to provide a relative actuation between the two in the Y direction; and, a sixth actuator may be used between the third intermediate stage and the Motion Stage to provide a relative actuation between the in the Z direction.

In yet another embodiment, additional intermediate stages and flexure constraint modules may be included in the motion system so as to increase geometric symmetry, while maintaining the key innovative aspects of systematic parallel kinematic flexure bearing design, actuator isolation to provide ground-mounted actuators, and a combination of sensors to achieve end-point displacement measurement. Geometric symmetry often helps improve robustness against assembly and manufacturing errors.

In yet another embodiment of this invention, the motion system 410 additionally includes means for vibration damping to improve it performance. Damping in the X displacement direction may be introduced between the first intermediate stage 21 and Ground 20; damping in the Y displacement direction may be introduced between the second intermediate stage 22 and Ground 20; and, damping in the Z displacement direction may be introduced between the third intermediate stage 23 and Ground 20.

Furthermore, the relative X displacement between the Motion Stage 30 and first intermediate stage 21 may be damped; the relative Y displacement between the Motion Stage 30 and the second intermediate stage 22 may be damped; and, the relative Z displacement between the Motion Stage 30 and the third intermediate stage 23 may be damped.

Each of the flexure constraint modules, 61, 62, 63, 64, 65, 66, 67, 68, 69, 70, 71, and 72, in the motion systems described herein allows a single translational DoF between the two rigid stages that it interconnects. Although each of these flexure constraint modules is shown to be a three-beam parallelogram flexure constraint module, in a more general sense, each flexure constraint module can be an assembly of flexible elements, rigid elements, and/or damping elements that allows only a single translational DoF and constrains the remaining five DoF between the two rigid stages that it interconnects. Accordingly, FIG. 5 illustrates various possible candidates for the flexure constraint modules described in this invention.

Figure 5A:
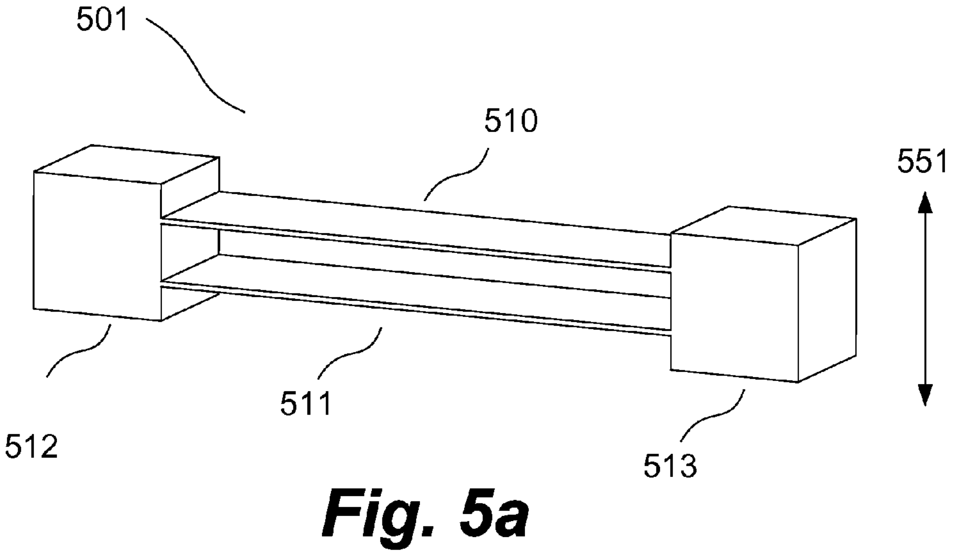
FIG. 5 shows several embodiments of single translational DoF flexure constraint modules.
Figure 5B:
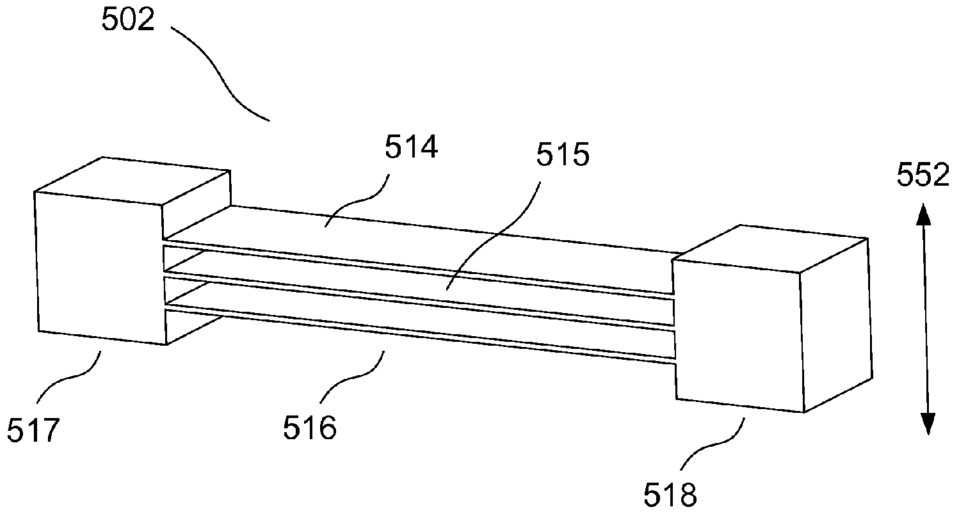
Figure 5C:
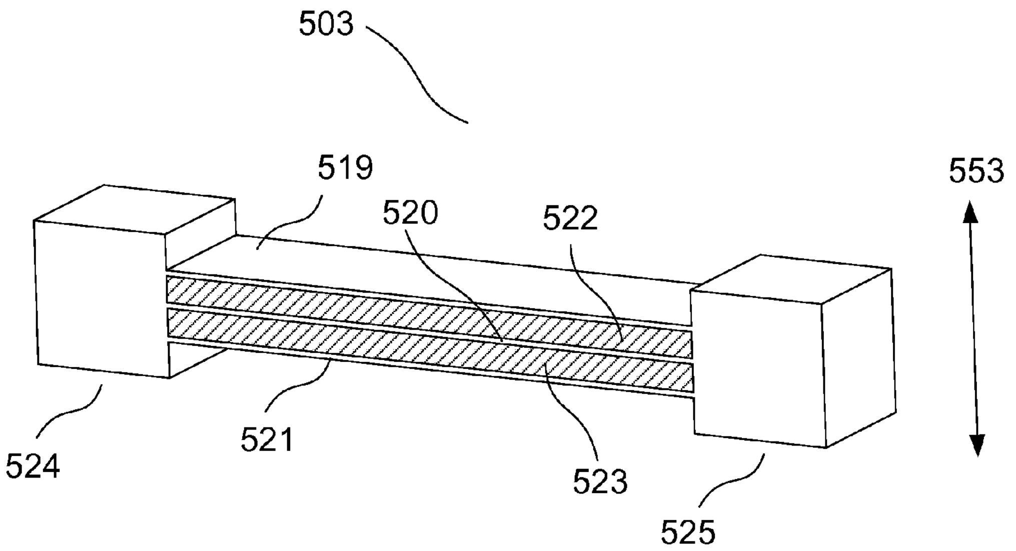

The two-beam parallelogram flexure constraint module 501 of FIG. 5A comprises of two parallel flexure beams, 510 and 511, that connect two rigid stages 512 and 513. Flexing of the thin flexure beams 510 and 511 provides a single translational DoF 551. The three-beam parallelogram flexure constraint module 502 of FIG. 5B comprises three parallel flexure beams, 514, 515 and 516, that connect two rigid stages 517 and 518. Flexing of the thin flexure beams 514, 515 and 516 provides a single translational DoF 552. The damped three-beam parallelogram flexure constraint module 503 of FIG. 5C comprises an alternating arrangement of parallel flexure beams, 519, 520 and 521, and damping elements 522 and 523, all of which connect two rigid stages 524 and 525. Flexing of the thin flexure beams 522, 523 and 524 provides a single translational DoF 553.

Figure 5D:
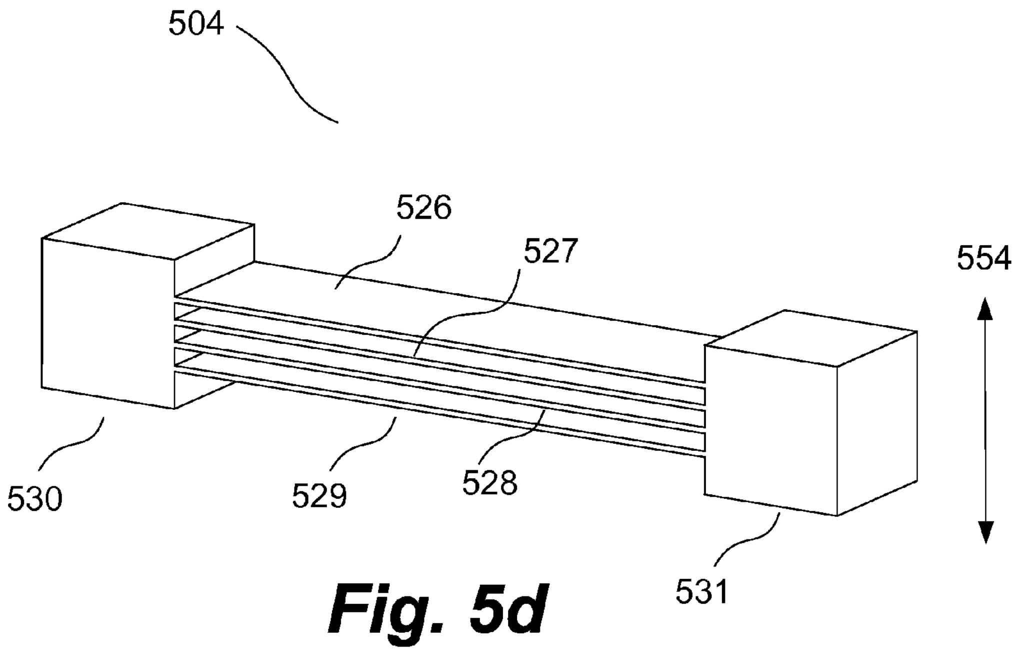
Figure 5E:
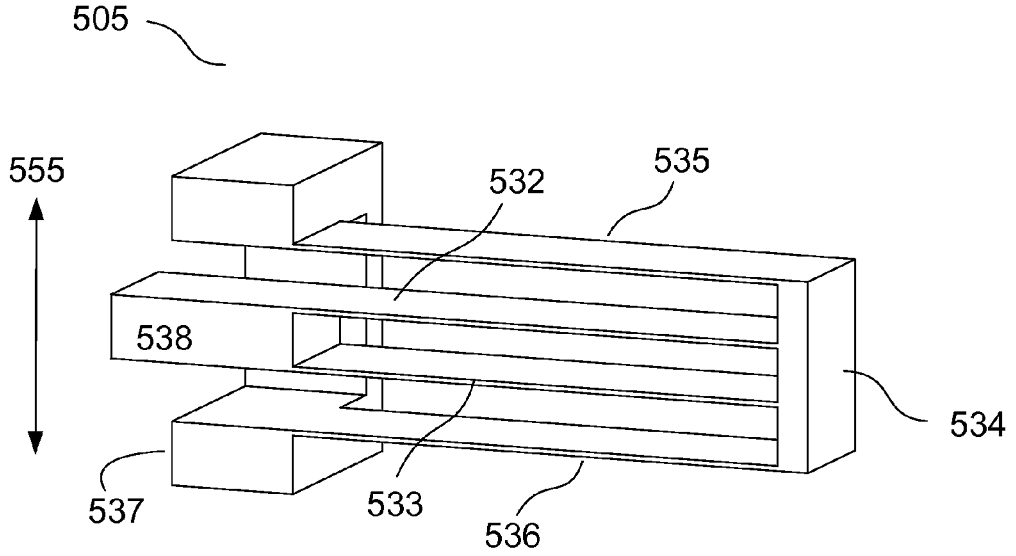
Figure 5F:
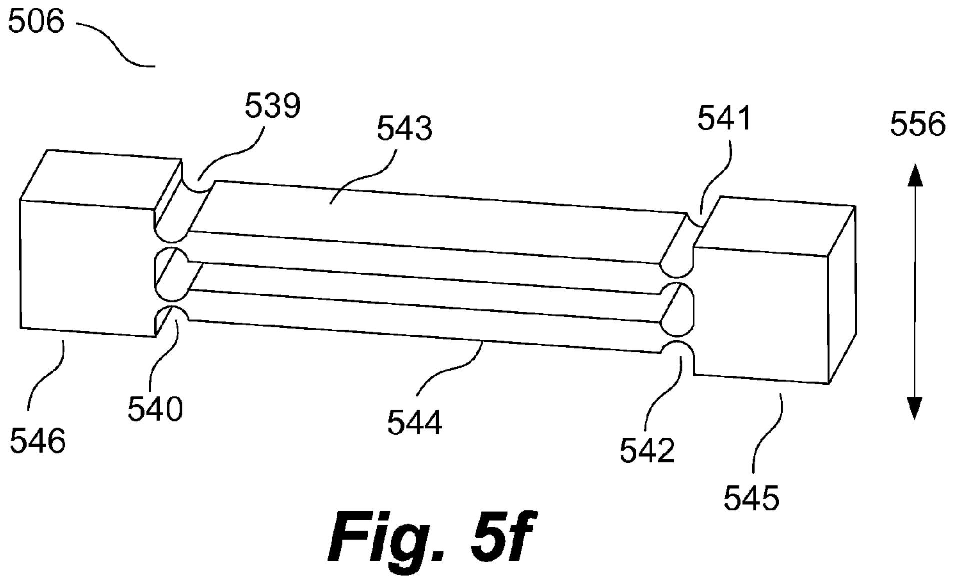

The four-beam parallelogram flexure constraint module 504 of FIG. 5D comprises four parallel flexure beams, 526, 527 528, and 529, that connect two rigid stages 530 and 531. Flexing of the thin flexure beams 526, 527, 528, and 529 provides a single translational DoF 554. The compound two-beam parallelogram flexure constraint module 505 of FIG. 5E comprises two parallel flexure beams, 532 and 533, a rigid element 534, and another two parallel flexure beams 535 and 536, all of which connect two rigid stages 537 and 538. Flexing of the thin flexure beams 532, 533, 535, and 536 provides a single translational DoF 555. The two-link parallelogram flexure constraint module 506 of FIG. 5F comprises of four flexure hinges, 539, 540, 541 and 542, and two rigid elements 543 and 544, all of which connect two rigid stages 545 and 546. Flexing of the thin flexure hinges 539, 540, 541, and 542 provides a single translational DoF 556.

It should be understood that FIG. 5 illustrates exemplary flexure constraint modules, and in general, any single translational DoF constraint module may be used in the motion systems described herein.

While the motion systems described herein are shown to comprise flexure constraint modules that identical in geometry, in general this need not be the case. In fact, any combination of single translational DoF flexure constraint modules may be used in a given motion system.

Though a single DoF constraint modules is the most preferred for the optimal performance of the described motion system, in certain cases instead of a single DoF constraint module a 3 DoF constraint module, e.g. a single beam flexure constraint module, may also be used.

While in the most preferred embodiments described herein, the three translational DoF directions X, Y and Z, are considered to be substantially perpendicular to each other, in a more general sense, these three DoF directions can be at other angles with respect to each other.

While motion systems that provide three translational Degrees of Freedom have been described here, the idea of arranging flexure constraint modules, rigid stages, sensors and actuators in a fashion to achieve decoupled motion between the DoF, actuator isolation, and end-point measurement, is more generally applicable. Thus, large range and high motion quality motion systems with any other combination of translational and/or rotational DoF may be envisioned, for example, two translational DoF, or two rotational DoF, or three rotational DoF, or two translational and one rotational DoF, etc.

While in the most preferred embodiment, end-point displacement measurement is achieved via at least two sensors along each motion DoF, in a more general case three of more sensors may be used sequentially to measure the displacement of the Motion Stage in a particular direction with respect to Ground.

It should be understood that the invention described herein is not restricted to any particular scale or size; on the contrary, it is applicable at any scale including the macro scale, meso scale, and MEMS (Micro Electro Mechanical Systems) scale.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A motion system comprising:

a ground stage and a motion Stage;

a first direction, a second direction and a third direction;

a first intermediate stage that is constrained to move along said first direction with respect to said ground stage, and along said second and third directions with respect to said motion stage;

a second intermediate stage that is constrained to move along said second direction with respect to said ground stage, and along said first and third directions with respect to said motion stage; and a third intermediate stage that is constrained to move along said third direction with respect to said ground stage, and along said first and second directions with respect to said motion stage.

2. The motion system of claim 1 that further includes a first actuator that generates a force or displacement in said first direction on said first intermediate stage with respect to said ground stage.

3. The motion system of claim 1 that further includes a second actuator that generates a force or displacement in said second direction on said second intermediate stage with respect to said ground stage.

4. The motion system of claim 1 that further includes a third actuator that generates a force or displacement in said third direction on said third intermediate stage with respect to said ground stage.

5. The motion system of claim 1 that further includes a first sensor that measures the displacement of said first intermediate stage along said first direction with respect to said ground stage.

6. The motion system of claim 1 that further includes a second sensor that measures the displacement of said second intermediate stage along said second direction with respect to said ground stage.

7. The motion system of claim 1 that further includes a third sensor that measures the displacement of said third intermediate stage along said third direction with respect to said ground stage.

8. The motion system of claim 5 that further includes a fourth sensor that measures the displacement of said motion stage along said first direction with respect to said first intermediate stage.

9. The motion system of claim 6 that further includes a fifth sensor that measures the displacement of said motion stage along said second direction with respect to said second intermediate stage.

10. The motion system of claim 7 that further includes a sixth sensor that measures the displacement of said motion stage along said third direction with respect to said third intermediate stage.

11. The motion system of claim 1 that further includes a fourth intermediate stage, a fifth intermediate stage, and a sixth intermediate stage.

12. The motion system of claim 11, wherein:

said ground stage is connected to said first intermediate stage via a first flexure constraint module that allows relative translation in said first direction;

said ground stage is connected to said second intermediate stage via a second flexure constraint module that allows relative translation in said second direction;

said ground stage is connected to said third intermediate stage via a third flexure constraint module that allows relative translation in said third direction;

said first intermediate stage is connected to said fourth intermediate stage via a fourth flexure constraint module that allows relative translation in said second direction;

said fourth intermediate stage is connected to said motion stage via a fifth flexure constraint module that allows relative translation in said third direction;

said second intermediate stage is connected to said fifth intermediate stage via a sixth flexure constraint module that allows relative translation in said third direction;

said fifth intermediate stage is connected to said motion stage via a seventh flexure constraint module that allows relative translation along said first direction;

said third intermediate stage is connected to said sixth intermediate stage via an eighth flexure constraint module that allows relative translation along said first direction;

said sixth intermediate stage is connected to said motion stage via a ninth flexure constraint module that allows relative translation along said second direction;

said first intermediate stage is connected to said sixth intermediate stage via a tenth flexure constraint module that allows a relative translation along said third direction;

said second intermediate stage is connected to said fourth intermediate stage via an eleventh flexure constraint module that allows a relative translation along said first direction; and said third intermediate stage is connected to said fifth intermediate stage via a twelfth flexure constraint module that allows a relative translation along said second direction.

13. The motion system of claim 12, wherein each of said first, second, third, fourth, fifth, sixth, seventh, eighth, ninth, tenth, eleventh, and twelfth flexure constraint modules is a two-beam parallelogram flexure constraint module, a three-beam parallelogram flexure constraint module, a damped three-beam parallelogram flexure constraint module, a four-beam parallelogram flexure constraint module, a two-link parallelogram flexure constraint module, or a compound two-beam parallelogram flexure constraint module.

14. The motion system of claim 1 wherein said first, second and third directions are mutually perpendicular.

15. The motion system of claim 1 that further includes an open-loop or closed-loop controller.

16. The motion system of claim 1, wherein:

the relative motion of said first intermediate stage, in said first direction, with respect to said ground stage is damped;

the relative motion of said second intermediate stage, in said second direction, with respect to said ground stage is damped; and the relative motion of said third intermediate stage, in said third direction, with respect to said ground stage is damped.

17. The motion system of claim 1, wherein:

the relative motion of said motion stage, in said first direction, with respect to said first intermediate stage is damped;

the relative motion of said motion stage, in said second direction, with respect to said second intermediate stage is damped; and the relative motion of the motion stage, in said third direction, with respect to said third intermediate stage is damped.

* * * * *